United States Patent [19]

Peek

[11] Patent Number: 5,306,390

[45] Date of Patent: Apr. 26, 1994

[54] METHOD OF MANUFACTURING A SEMICONDUCTOR DEVICE USING AN IMPLANTATION MASK

[75] Inventor: Hermanus L. Peek, Eindhoven, Netherlands

[73] Assignee: U.S. Philips Corp., New York, N.Y.

[21] Appl. No.: 876,952

[22] Filed: Apr. 30, 1992

[30] Foreign Application Priority Data

May 3, 1991 [EP] European Pat. Off. ......... 91201052.7

[51] Int. Cl.$^5$ .......................................... H01L 21/312
[52] U.S. Cl. .................................. 156/659.1; 437/35; 437/67
[58] Field of Search ............. 148/DIG. 50, DIG. 137; 156/640, 659.1; 430/313, 314, 35, 67

[56] References Cited

U.S. PATENT DOCUMENTS

| | | | |
|---|---|---|---|
| 4,466,178 | 8/1984 | Soclof | 437/35 |
| 4,466,180 | 8/1984 | Soclof | 437/67 |
| 4,693,781 | 9/1987 | Leung et al. | 156/659.1 |
| 4,756,793 | 7/1988 | Peek | 437/35 |

OTHER PUBLICATIONS

"Image Reversal Applications for Micron and Submicron Patterning" Proc. Electrochem. Soc. 1987 (VLSI) pp. 190–210.

Primary Examiner—Tom Thomas
Assistant Examiner—C. Chaudhari
Attorney, Agent, or Firm—Steven R. Biren

[57] ABSTRACT

For manufacturing an implantation mask on a semiconductor surface which is provided with grooves, a positive photoresist is provided on the surface. Portions of the photoresist which are to form the implantation mask are illuminated in a first step and rendered insoluble in the developer in an image reversal step. The photoresist is then illuminated without mask and developed, so that the portions not illuminated during the first step are removed. The implantation mask thus obtained has a receding profile, the openings at the area of the grooves becoming wider in the direction of the bottom of the grooves.

5 Claims, 3 Drawing Sheets

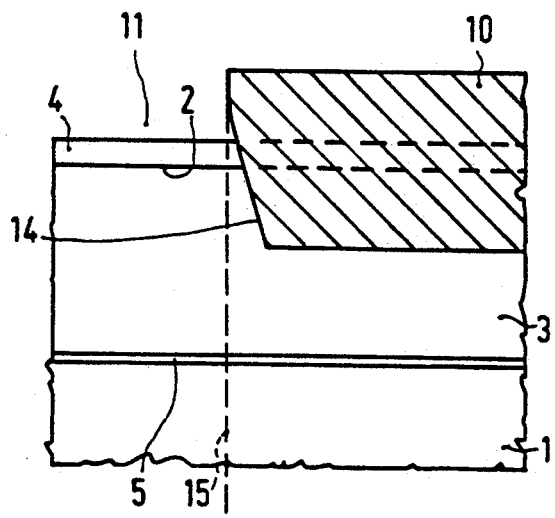
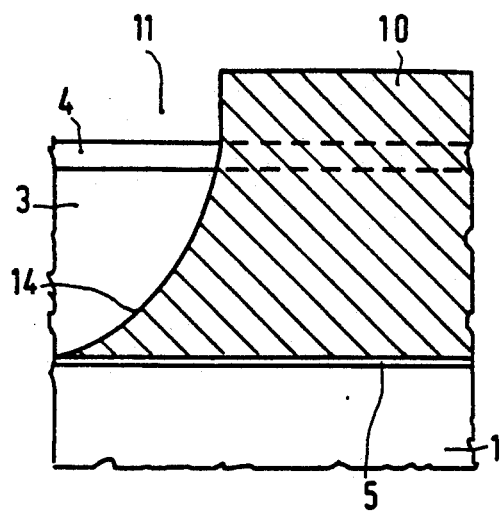
FIG.7a  FIG.7b
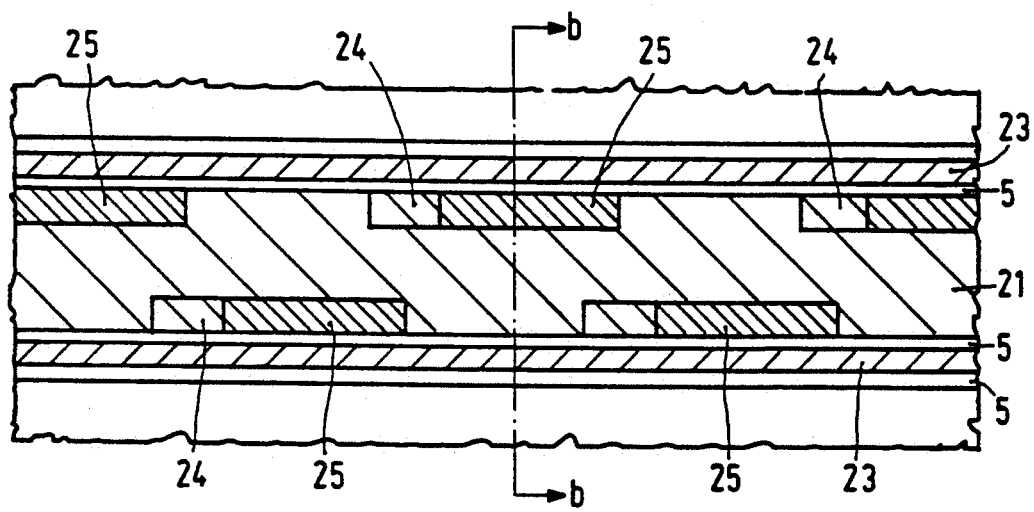
FIG.8a
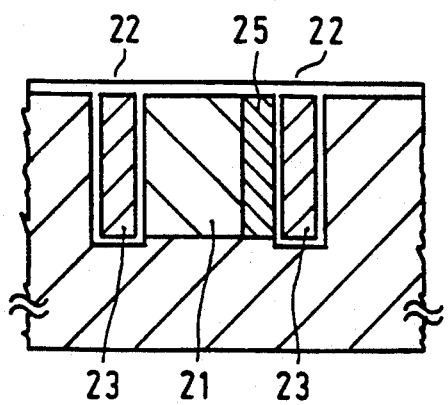
FIG.8b

METHOD OF MANUFACTURING A SEMICONDUCTOR DEVICE USING AN IMPLANTATION MASK

BACKGROUND OF THE INVENTION

The invention relates to a method of manufacturing a semiconductor device whereby a semiconductor body is provided at a surface with at least one groove which extends from the surface into the semiconductor body, a zone doped with an impurity being provided in a portion of the groove by means of ion implantation through a mask. The invention also relates to a semiconductor device manufactured by such a method.

The groove, which may have, for example, a U- or V-shape, may form a separation region between active regions, such as an island insulation in bipolar circuits. In an alternative embodiment, a conducting layer is provided in the groove, forming a gate electrode of a charge-coupled device such as described in, for example, the European Patent Application EP 0 239 151 filed by Applicant and laid open to public inspection on Sep. 30, 1987. In this device, the transport channel is situated in a mesa limited by two parallel grooves, the charge transport taking place along the walls of the mesa. Zones are formed locally in the walls, defining the charge storage locations in the channel.

U.S. Pat. No. 4,466,178 describes a method by which groove walls are doped by oblique implantation. In this method, doped zones are provided over the entire length of the grooves. It is often desirable, however, to provide the walls and/or the bottom of the groove or grooves only locally with doped zones which are provided over only a portion of the groove length.

Major practical drawbacks are involved, however, in the local implantation, i.e. not covering the entire groove length, of doped zones in narrow grooves which are relatively deep compared with their width. An obvious method is to use an implantation mask of photoresist. The realisation of a well-defined photoresist mask which leaves exposed only a portion of the groove bottom in a groove having a width of, for example, 2 microns or less and a depth of more than 3 microns is practically impossible. To illuminate the photoresist down to the groove bottom would require such a great illumination dose that the mask definition near the surface 7/uld become very bad, while the photoresist in the bottom of the groove would not or insufficiently be illuminated in the case of smaller illumination doses.

A method of the kind described in the opening paragraph is known from U.S. Pat. No. 4,756,793. In this known method, the grooves are temporarily filled up with a filler material, for example photoresist, so that an at least substantially plane surface is obtained. On this surface is provided an implantation mask of metal, for example Al, which has one or several openings where in a subsequent step the dopant is to be provided in the groove or grooves. The filler material is then removed from the groove or grooves at least at the areas of the windows in the implantation mask, or from the entire groove or grooves, upon which the implantation is carried out through the 7indows in the implantation mask. The implantation mask is then removed again.

SUMMARY OF THE INVENTION

The invention has for its object inter alia to provide a method which comprises considerably fewer steps than does the known method, and is thus much simpler, while a high mask definition is retained.

A method of the kind described above, according to the invention, is characterized in that a positive photoresist layer is provided on the surface and in the groove, in that the photoresist layer is masked against irradiation at the area of the ion implantation to be carried out and the non-masked portions of the photoresist layer are subjected to irradiation, after which the irradiated portions of the photoresist layer are rendered insoluble by means of an image reversal process, and in that subsequently the photoresist layer is subjected to irradiation in a second irradiation step at the area of the ion implantation to be carried out, after which the portions of the photoresist layer masked during the irradiation step first mentioned are removed by development. As will be apparent from the description of the Figures, an implantation mask may be obtained in this way which has a sharp definition at the surface and at the same time leaves the groove exposed over its entire thickness wherever implantation is to take place.

The first irradiation step may be carried out with a comparatively low irradiation dose, so that a sharp mask definition at the surface is achieved. A possible result of this comparatively low dose is that the photoresist is not fully irradiated down to the bottom, so that the windows in the implantation mask to be formed become greater in the depth direction of the groove. This is not a disadvantage, however, because of the shadow effect of the implantation mask. The second irradiation step, which only serves to render the remaining portions of the photoresist layer soluble, may be carried out with a comparatively high dose in such a way that the photoresist is irradiated throughout its entire thickness. It is ensured in this way that the photoresist is removed throughout the entire depth of the groove (or grooves) at the areas of the windows in the implantation mask.

BRIEF DESCRIPTION OF THE DRAWINGS

The invention will be explained in more detail with reference to an embodiment and the accompanying diagrammatic drawing, in which:

FIGS. 1–7b show an embodiment of the invention in a number of stages in the process and;

FIGS. 8a–8b are plan views of a device manufactured by a method according to the invention.

It is noted that the Figures are diagrammatic and not drawn to scale.

DESCRIPTION OF THE PREFERRED EMBODIMENTS

Figure 3:
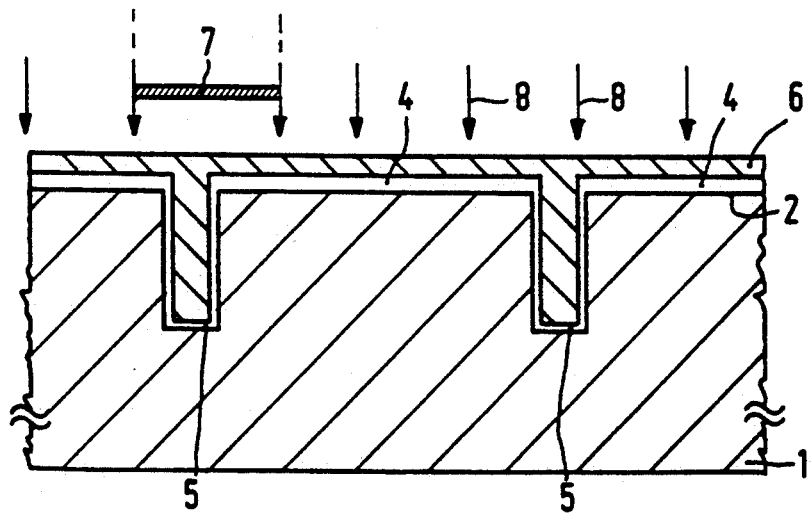
Figure 4:
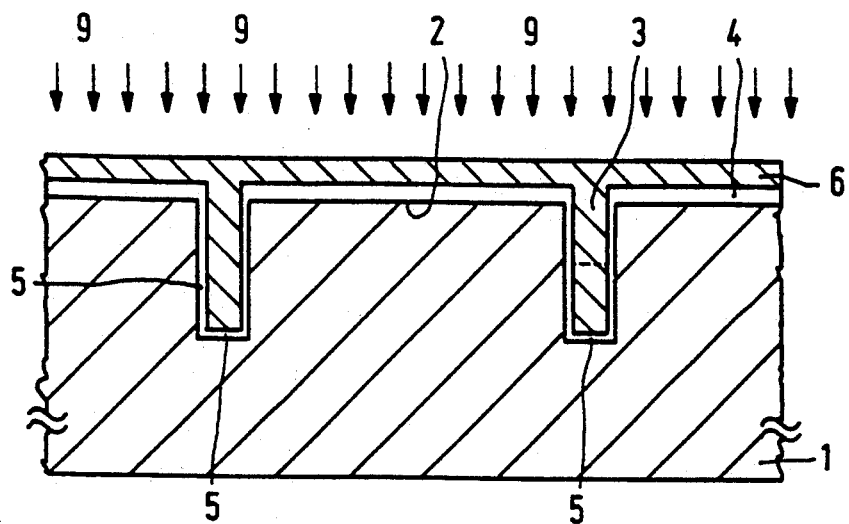
Figure 5:
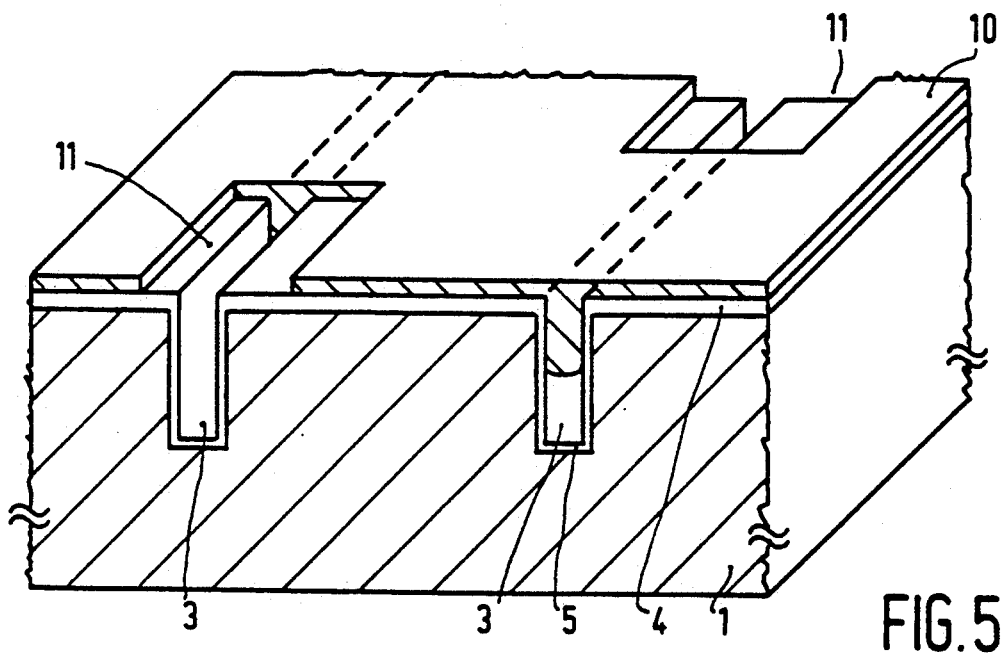
Figure 6:
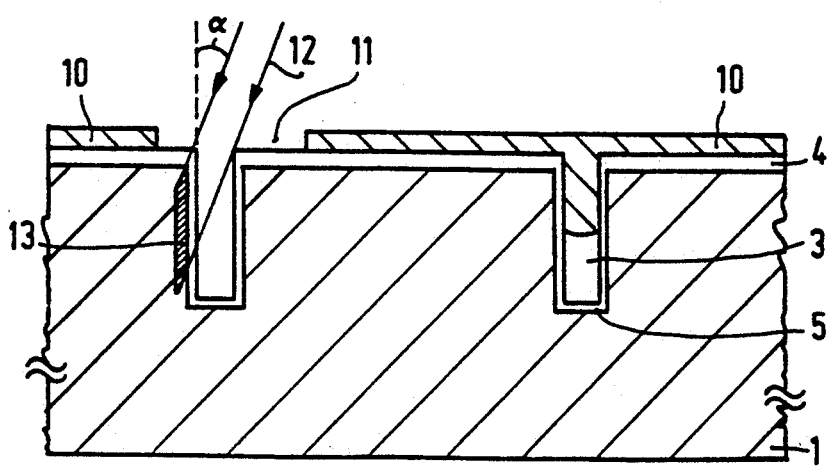

FIGS. 1–7 show in a purely diagrammatical way how by means of a method according to the invention one or several doped zones can be implanted in very narrow and comparatively deep grooves over only a portion of the length in the walls and/or the bottom of the groove or grooves. FIG. 5 for this purpose shows a portion of the device in perspective view; FIGS. 2–4 and 6 show the device in a cross-section corresponding to the front face in FIG. 5; FIG. 7b gives a cross-section in the longitudinal direction of the groove; and FIG. 7a gives the same section when a conventional method is used.

Figure 1:
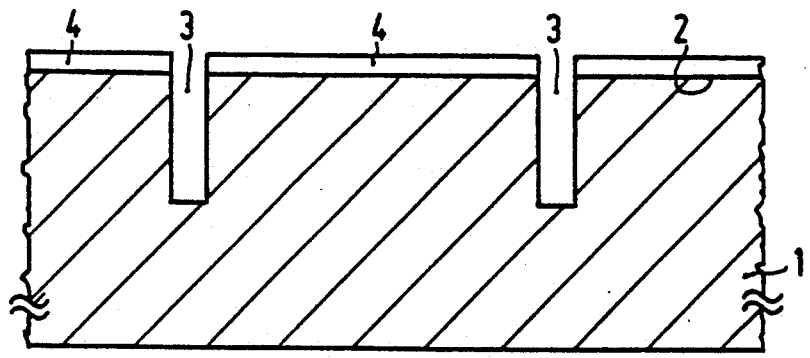
Figure 2:
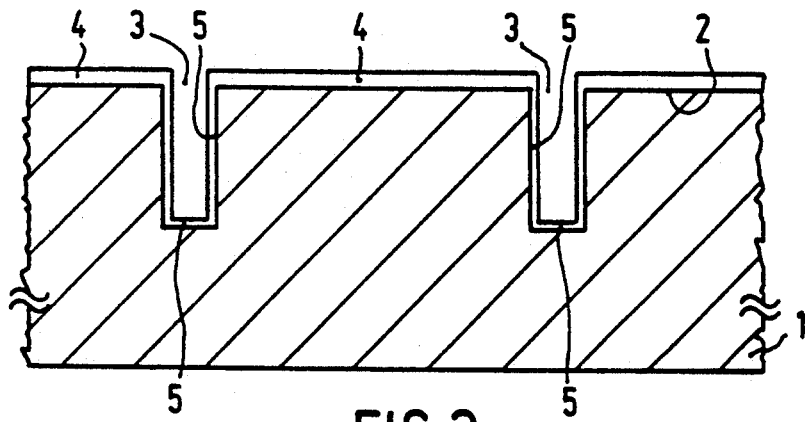

The starting material is, for example, a semiconductor substrate 1 of silicon (see FIG. 1). Grooves, of which only two are shown in FIG. 3,. are etched into the surface 2. These grooves, which have, for example, a width of approximately 1 micron and a depth of approximately 4 microns, and which are therefore very narrow in relation to their depth, may be formed by a method known per se, for example, by reactive ion etching (RIE). Such grooves may be formed for various purposes and are often used as separation grooves between the portions of a monolithic integrated circuit. In the present example, the grooves 3 are etched by means of an oxide mask 4 on the surface 2 outside the region of the grooves. The oxide layer 4 has a thickness of 0.5 micron. An approximately 20 nm thick oxide layer 5 (see FIG. 2) is grown on the walls and the bottom of the grooves 3 by means of a light thermal oxidation.

A positive photoresist layer 6 is then provided on the surface 2 and in the grooves 3 for the implantation mask. "Positive" here denotes a photoresist of which the illuminated portions are removed during normal use after illumination and development. In the example described here, the photoresist marketed by the Hunt Company under the name HPR 204 is used for the layer 6. The thickness of the layer 6 outside the grooves is approximately 1.3 microns (see FIG. 3).

The photoresist layer 6 is irradiated or illuminated, indicated in FIG. 3 with the arrows 8, through a mask 7 which masks the photoresist 6 at the areas of openings in the implantation mask to be formed. The illumination intensity is chosen to be comparatively low, i.e. the photoresist layer 6 is effectively illuminated in the grooves not throughout the entire thickness, down to the bottom of the grooves, but only to approximately halfway the groove, i.e. to a depth of 1 to 2 microns. This comparatively weak intensity renders a sharp definition of the implantation mask possible.

In a next stage, an image reversal step is carried out by which the illuminated portion of the photoresist 6 becomes insoluble during the development of the photoresist at a later stage. Such image reversal steps are known per se, for example, from the article "Image Reversal, Applications for Micron and Sub-Micron Patterning" by S. K. Jones et al., published in Proc. Electr. Soc. 1987, pp. 190–210. Acid is formed in the photoresist owing to the illumination. After illumination, a gas flow containing $NH_3$ is conducted over the device, for example, during 30 minutes at a temperature of 105° C., so that the illuminated, acid region in the photoresist becomes insoluble (in the developer).

In a next stage (see FIG. 4), a maskless illumination step is carried out, indicated diagrammatically by the arrows 9 in the drawing. The intensity of the illumination 9 is so chosen that, at a given illumination time, the photoresist layer 6 is illuminated throughout its entire thickness, also in the grooves 3. The portions of the photoresist layer 6 masked during the first illumination step are rendered insoluble for the ensuing development step by this.

The photoresist layer 6 is developed in, for example, a 1:1 solution of a developer marketed under the name LSI by the Waycoat Company. The development time is so chosen that the photoresist 6, at least the portion illuminated during the step shown in FIG. 4, is removed over its entire thickness, down to the bottom of the grooves. Since the photoresist has been rendered insoluble in the grooves only to approximately halfway down the groove depth during the image reversal step, owing to the preceding weak illumination, the photoresist is also removed by the developer in the grooves below the implantation mask obtained (see FIG. 5). Since the masking is based on a shadow effect, this is not a disadvantage. The implantation mask 10 formed from a single photoresist layer, comprising windows 11 above and in the grooves 3, is ready now. It is noted that windows 11 are formed at the areas of the grooves only in the drawing. It will be completely obvious, however, that a window 11 may be formed in the implantation mask lying completely outside the grooves 3 if a zone is to be doped also in the plane portions of the substrate, i.e., for example, in the region between the grooves 3.

In a next stage (see FIG. 6), the impurity is implanted in the grooves 3, which is diagrammatically shown by the arrows 12. The impurity may be, for example, an n- or p-type dopant. Through a suitable choice of the angle at which the implantation is carried out it can be determined whether the side walls or the bottoms of the grooves are doped. In the embodiment described here, the angle $\alpha$ is so chosen that the side walls of the grooves 3 are provided with a doped zone 13. The depth of the zone 13 may also be adjusted by means of the implantation angle. If the opposite wall is to be doped, the semiconductor body may be rotated through an angle of 180°. Other zones may be provided, for example, having a different conductivity type or the same conductivity type but a different concentration in that the process described above is repeated. The implantation mask 10 may be removed after the implantation, after which the device is subjected to further necessary process steps which are outside the scope of the invention and are accordingly not described here any further.

To clarify the effect of the invention, FIG. 7a shows a longitudinal section of a groove in a portion of the device comprising the edge of a window 11. The mask 10 does not have a straight wall 14 perpendicular to the surface 2, but a wall with a slope, so that the window 11 in the implantation mask 10 becomes wider from top to bottom. The portion of the groove wall which is doped is determined, as a result of the shadow effect, by the portion of the mask situated on the surface 2. The boundary between the implanted and the non-implanted portion of the groove is indicated with the broken line 15 in FIG. 7a. For comparison, FIG. 7b shows the same section as FIG. 7a with a photoresist mask 10 manufactured in a conventional manner. The photoresist mask 10 is again formed from a positive photoresist of which the portions to be removed are defined in usual manner by a single illumination and removed through development. Owing to the comparatively great thickness of the photoresist in the groove 3 and the decreasing illumination intensity in the depth direction of the groove, the photoresist mask 10 is given the profile 14 shown in FIG. 7b, the window 11 becoming smaller in vertical direction. Accordingly, the window 11 is smaller in the groove than at the surface, so that the region in the groove to be implanted is no longer well-defined.

It is noted that the photoresist profile 14 of FIG. 7a could in principle also be obtained through the use of a negative photoresist and a single illumination. Generally, however, positive photoresists are preferred in semiconductor technology, one of the reasons being that it is more difficult to make very small windows in negative photoresists, which imposes limitations on the smallest possible dimensions in the device to be manufactured.

FIGS. 8a and 8b show a charge-coupled device manufactured by the method described above in plan view and in cross-section taken on the line b—b, respectively. For a detailed description of the construction and operation of the device, reference is made to the European Patent Application 0 239 151 cited above, FIG. 1ff., and the accompanying description. The device comprises a mesa-shaped channel 21 which is bounded in its longitudinal direction by two grooves 22. The walls and the bottom of the grooves are covered with a thin oxide layer 5. The grooves are further filled with tracks 23 of a conducting material, for example polycrystalline silicon, which form the gate electrodes of the charge-coupled device. During operation, the charge is transported in zigzag manner through the channel, in FIG. 8a from left to right, jumping from one side of the mesa to the opposing side of the mesa at each step. The sides of the mesa, i.e. the walls of the grooves 22, are for that purpose provided with doped zones 24 and 25 which form transfer regions and storage regions, respectively. The zones 24, 25 may be of the same conductivity type, for example the n-type, assuming that the device is of the n-channel type, the zones 25 having a higher concentration than the zones 24. The zones 24, 25 may be formed by ion implantation, the more weakly doped zones 24 being provided first, for example, by means of a photomask formed by the method described above. To avoid critical alignment steps as much as possible, these zones are so provided that they overlap the regions of the zones 25 to be provided later. Then a new implantation mask of photoresist is provided which leaves the areas of the zones 25 exposed, upon which the zones 25 are formed by a second implantation.

It will be obvious that the invention is not limited to the embodiments given here, but that many more variations are possible to those skilled in the art within the scope of the invention. Thus the grooves may form insulating regions between adjoining active regions, various circuit elements of the circuit being provided in the grooves, as described in the U.S. Pat. No. 4,466,178 cited above. Photoresists other than those mentioned here may alternatively be used for the method described, as well as photoresists which are irradiated with electrons instead of with light (visible or UV). It is possible to illuminate down to the bottom of the groove by electron beam illumination of positive photoresist. An implantation mask 10 (see FIGS. 5 and 6) may be obtained in this way which extends down to the bottom of the groove 3.

I claim:

1. A method of manufacturing a semiconductor device whereby a semiconductor body is provided at a surface with at least one groove which extends from the surface into the semiconductor body, a zone doped with an impurity being provided in a portion of the groove by means of ion implantation through a mask, characterized in that a positive photoresist layer is provided on the surface and in the groove, in that the photoresist layer is masked against irradiation at the area of the ion implantation to be carried out and the non-masked portions of the photoresist layer are subjected to irradiation, after which the irradiated portions of the photoresist layer are rendered insoluble by means of an image reversal process, and in that subsequently the photoresist layer is subjected to irradiation in a second irradiation step at the area of the ion implantation to be carried out, after which the portions of the photoresist layer masked during the irradiation step first mentioned are removed by development.

2. A method as claimed in claim 1, characterized in that the second irradiation step is carried out with a higher irradiation dose than the first irradiation step.

3. A method as claimed in claim 1, characterized in that the doped zone is provided in a wall of the groove in that the ion implantation is carried out at an angle to the surface smaller than 90°.

4. A method as claimed in claim 1, characterized in that the surface and walls of the groove are covered with an insulating layer before the photoresist layer is provided.

5. A method as claimed in claim 1, characterized in that the doped zone forms part of a semiconductor circuit element.

* * * * *